(12) United States Patent
Watanabe

(10) Patent No.: US 10,784,425 B2
(45) Date of Patent: Sep. 22, 2020

(54) LIGHT ILLUMINATING MODULE AND WIRE BOARD FOR LED DEVICE

(71) Applicant: HOYA CANDEO OPTRONICS CORPORATION, Toda-shi, Saitama (JP)

(72) Inventor: Hiroki Watanabe, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 0 days.

(21) Appl. No.: 16/369,487

(22) Filed: Mar. 29, 2019

(65) Prior Publication Data

US 2019/0305204 A1 Oct. 3, 2019

(30) Foreign Application Priority Data

Mar. 29, 2018 (JP) .................. 2018-065461
Jan. 28, 2019 (JP) .................. 2019-011766

(51) Int. Cl.
*H01L 33/62* (2010.01)
*H01L 33/38* (2010.01)
*H05B 45/00* (2020.01)

(52) U.S. Cl.
CPC .............. *H01L 33/62* (2013.01); *H01L 33/38* (2013.01); *H05B 45/00* (2020.01)

(58) Field of Classification Search
CPC ..... H01L 33/62; H01L 33/38; H01L 25/0753; H05B 45/00; H05B 45/46; H05B 45/52
See application file for complete search history.

(56) References Cited

U.S. PATENT DOCUMENTS

2011/0175536 A1* 7/2011 Fujita .................. H05B 45/40
315/185 R

FOREIGN PATENT DOCUMENTS

JP 2014-027214 A 2/2014

\* cited by examiner

*Primary Examiner* — Quoc D Hoang
(74) *Attorney, Agent, or Firm* — Rabin & Berdo, P.C.

(57) ABSTRACT

The light illumination module includes a substrate, a plurality of wiring patterns formed in parallel on the substrate, and a plurality of LED devices disposed on the wiring patterns. Each wiring pattern has a stripe-shaped portion extending in a first direction, a first protrusion portion protruding in a second direction, and a second protrusion portion protruding in an opposite direction. The first and second protrusion portions are formed in an alternating manner along the first direction, and the LED devices are disposed on the first protrusion portion and the stripe-shaped portion at a location corresponding to the second protrusion portion. A first electrode of each LED device is electrically connected to the first protrusion portion or the stripe-shaped portion immediately below, and a second electrode of each LED device is electrically connected to the stripe-shaped portion or the second protrusion portion of an adjacent wiring pattern with a wire.

15 Claims, 11 Drawing Sheets

LIGHT ILLUMINATING MODULE AND WIRE BOARD FOR LED DEVICE

TECHNICAL FIELD

The present disclosure relates to a light illuminating module with a plurality of light emitting diode (LED) devices on a substrate and a wire board for a LED device that supplies power to the LED device.

BACKGROUND ART

Conventionally, an ultraviolet (UV) illumination apparatus is used to cure a UV curable ink used as an ink for sheet-fed offset printing.

As a UV illumination apparatus, a traditional lamp-type illumination apparatus using a high pressure mercury lamp or a mercury xenon lamp as a light source is known, but recently, in keeping with the demand for reduced power consumption, a longer service life and a compact device, a UV illumination apparatus using UV light emitting diode (LED) as an alternative to a traditional discharge lamp for a light source is put into commercialization (for example, Patent Literature 1).

FIG. 11 is a diagram showing the configuration of a light source unit (a UV illumination apparatus) described in Patent Literature 1; FIG. 11(A) is a plane view of the light source unit, and FIG. 11(B) is a diagram showing a wiring pattern (hatched) on a substrate 1 of the light source unit. As shown in FIG. 11, the light source unit described in Patent Literature 1 includes a substrate 1, a plurality of stripe-shaped wirings 2 disposed on the substrate 1, and a plurality of LED devices 3 disposed in a line on each stripe-shaped wiring 2. The LED devices 3 on each stripe-shaped wiring 2 are disposed in a staggered arrangement in a wiring direction with LED devices 3 on adjacent stripe-shaped wirings 2, and they are disposed in a staggered arrangement over the substrate 1. Additionally, a wire 5 connected to a top electrode 4 of each LED device 3 is connected to an area between LED devices 3 of an adjacent stripe-shaped wiring 2.

RELATED LITERATURES

Patent Literatures

Japanese Patent Publication No. 2014-27214

Non-Patent Literatures

DISCLOSURE

Technical Problem

As light emitting diode (LED) devices 3 are disposed in a staggered arrangement as described above, when a light source unit moves relatively with respect to a target (print media), it is possible to irradiate ultraviolet light thoroughly without a gap over the range as much as the movement width of the light source unit.

However, in the configuration of FIG. 11, five LED devices 3 arranged in a row in the wiring direction (i.e., left-right direction of FIG. 11) are connected in parallel, and LED devices 3 in eight rows in a direction (i.e., up-down direction of FIG. 11) perpendicular to the wiring direction are connected in series, and when the operating voltage Vf of each LED device 3 is 5 (v), Vp=5 (v)×8 rows=40 (v) is required for the operating voltage Vp of the entire light source unit. To further improve the freedom of design for creepage distance or clearance distance from a neighboring component or an adjacent other light illumination module, a lower operating voltage Vp is desirable from the perspective of safety standards.

To reduce the operating voltage Vp, increasing the number of LED devices 3 in a row (i.e., the number of LED devices 3 connected in parallel) may be contemplated, but the configuration of FIG. 11 needs to install a space (a bonding area) for connecting the wire 5 between the LED devices 3 of each stripe-shaped wiring 2, so there is a physical limitation to increase the number of LED devices 3 in a row.

In view of this circumstance, the present disclosure is directed to providing a light illumination module (a light source unit) that increases the number of LED devices connected in parallel, and can operate at low voltage. The present disclosure is further directed to providing a wiring substrate for a LED device that supplies power to the LED device of the light illumination module.

Technical Solution

To achieve the above-described object, a light illumination module of the present disclosure includes a substrate, a plurality of wiring patterns formed in parallel on the substrate, and a plurality of light emitting diode (LED) devices disposed on the wiring patterns to emit light in a direction perpendicular to a surface of the substrate, wherein each wiring pattern has a stripe-shaped portion extending in a shape of a straight line in a first direction on the surface of the substrate, a first protrusion portion protruding in a second direction perpendicular to the first direction from the stripe-shaped portion, and a second protrusion portion protruding in a direction opposite to the second direction from the stripe-shaped portion, the first protrusion portion and the second protrusion portion are formed in an alternating manner along the first direction, the plurality of LED devices is disposed on the first protrusion portion and the stripe-shaped portion at a location corresponding to the second protrusion portion, and a first electrode of each LED device is electrically connected to the first protrusion portion or the stripe-shaped portion immediately below, and a second electrode of each LED device is electrically connected to the stripe-shaped portion or the second protrusion portion of an adjacent wiring pattern with a wire.

According to this configuration, the LED devices 13 are arranged in two rows in the second direction on each wiring pattern and connected in parallel. Accordingly, it is possible to increase the number of LED devices connected in parallel, and operate the plurality of LED devices at low voltage, compared to the related art.

Additionally, preferably, the first protrusion portion and the second protrusion portion show a trapezoidal shape.

Additionally, preferably, the first protrusion portion and the second protrusion portion show a rectangular shape.

Additionally, in this case, preferably, a non-patterned area is installed at a location near each LED device of the stripe-shaped portion, the first protrusion portion and the second protrusion portion.

Additionally, preferably, a front part of the first protrusion portion is approximately the same as a size of the LED device, and part other than the front part is thinner than a width of the LED device.

Additionally, preferably, a width of the second direction of the stripe-shaped portion is wider than the width of the LED device.

Additionally, preferably, a width of the second direction of the stripe-shaped portion is narrower than the width of the LED device.

Additionally, preferably, the plurality of LED devices is disposed in a staggered arrangement over the substrate.

In another aspect, a wiring substrate for a LED device of the present disclosure includes a substrate, and a plurality of wiring patterns formed in parallel on the substrate to supply power to a plurality of LED devices disposed on the substrate, wherein each wiring pattern has a stripe-shaped portion extending in a shape of a straight line in a first direction on a surface of the substrate, a first protrusion portion protruding in a second direction perpendicular to the first direction from the stripe-shaped portion, and a second protrusion portion protruding in a direction opposite to the second direction from the stripe-shaped portion, the first protrusion portion and the second protrusion portion are formed in an alternating manner along the first direction, and a LED placement area for placing the LED device is formed on the first protrusion portion and the stripe-shaped portion at a location corresponding to the second protrusion portion.

Advantageous Effects

As described above, according to the present disclosure, it is possible to implement a light illumination module that can operate light emitting diode (LED) devices at low voltage with a staggered arrangement of LED devices.

BEST MODE

Figure 1A:
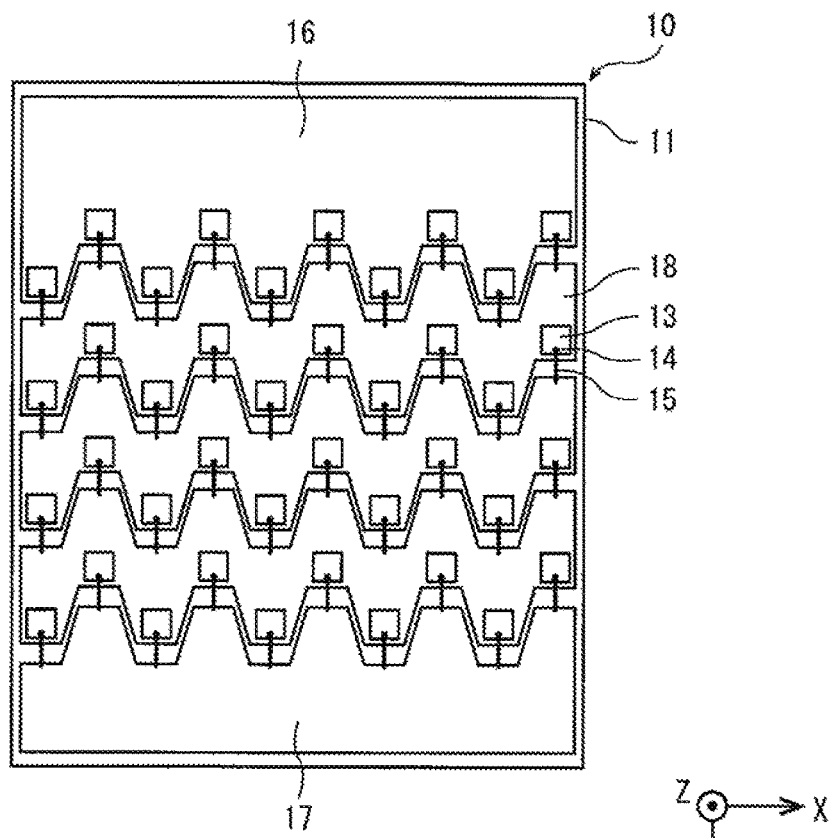
FIGS. 1A and 1B are diagrams illustrating the configuration of a light illumination module according to a first embodiment of the present disclosure.

Hereinafter, the embodiments of the present disclosure will be described in detail with reference to the accompanying drawings. Additionally, in the drawings, identical or equivalent elements are given identical reference signs, and redundant descriptions are omitted herein.

First Embodiment

Figure 1B:
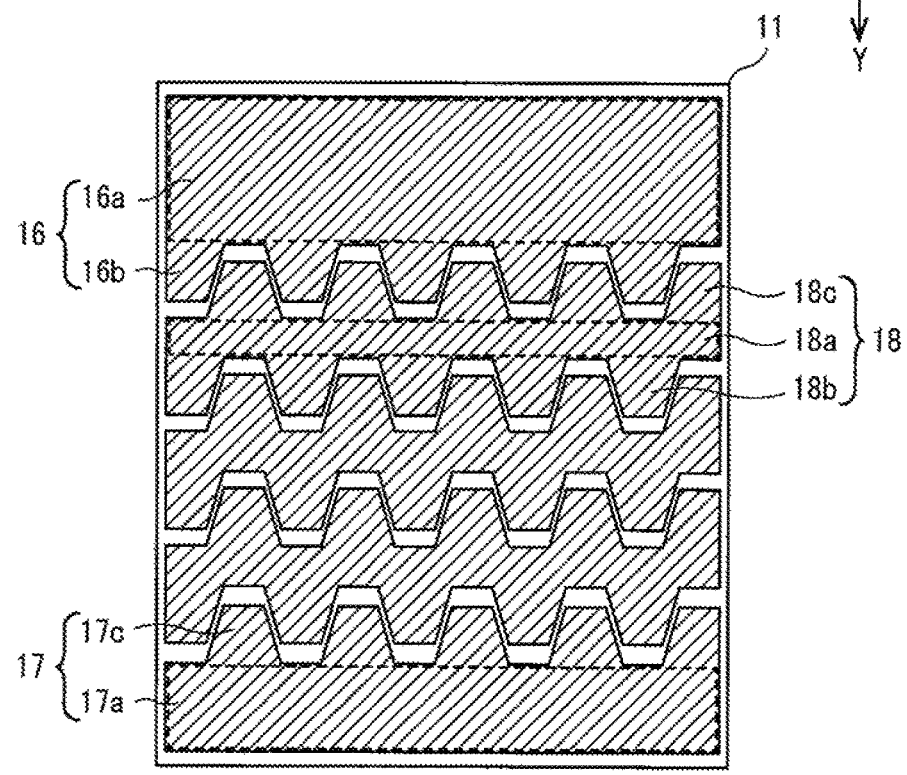

FIG. 1 is a diagram illustrating a schematic configuration of a light illumination module 10 according to a first embodiment of the present disclosure. FIG. 1(A) is a plane view of the light illumination module 10, and FIG. 1(B) is a wiring pattern diagram of the light illumination module 10. The light illumination module 10 of this embodiment is a device that is mounted in an ultraviolet (UV) illumination apparatus to emit UV light, and generally, one or more light illumination modules 10 are disposed on a base (for example, a heat sink) not shown, and are received in the UV illumination apparatus.

As shown in FIG. 1(A), the light illumination module 10 of this embodiment includes a substrate 11, and a plurality of LED devices 13 (forty LED devices in FIG. 1(A)) disposed on the surface of the substrate 11. Additionally, a pattern for power 16, a pattern for ground 17 and a plurality of wiring patterns 18 are formed on the substrate 11. Additionally, in the specification, a direction in which UV light emitted from the light illumination module 10 travels is defined as a Z-axis direction, a direction (left-right direction of FIG. 1) in which the wiring pattern 18 extends is defined as an X-axis direction, and a direction (up-down direction of FIG. 1) perpendicular to the X-axis direction and the Z-axis direction is defined as a Y-axis direction.

The substrate 11 is, for example, a rectangular ceramic substrate made of aluminum nitride having high thermal conductivity, and the pattern for power 16 that is electrically connected to a power terminal (not shown) of an external power source device (not shown) is formed on one side (upper side in FIG. 1(A) and FIG. 1(B)) in the Y-axis direction, and the pattern for ground 17 that is electrically connected to a ground terminal (not shown) of the external power source device is formed on the other side (lower side in FIG. 1(A) and FIG. 1(B)) in the Y-axis direction. Additionally, three wiring patterns 18 are formed in parallel in the X-axis direction between the pattern for power 16 and the pattern for ground 17.

The pattern for power 16, the pattern for ground 17 and the wiring pattern 18 are a thin film of metal (for example, copper, gold) that supplies power to the LED device 13. As shown in FIG. 1(B), each wiring pattern 18 has a stripe-shaped portion 18a extending in the shape of a straight line in the X-axis direction, a first protrusion portion 18b protruding in the shape of a trapezoid in the Y-axis direction from the stripe-shaped portion 18a, and a second protrusion portion 18c protruding in the shape of a trapezoid in a direction opposite to the Y-axis direction from the stripe-shaped portion 18a. Additionally, in this embodiment, the first protrusion portion 18b and the second protrusion portion 18c of each wiring pattern 18 are formed in an alternating manner along the X-axis direction, the second protrusion portion 18c of an adjacent wiring pattern 18 is disposed between the first protrusion portions 18b of each wiring pattern 18, and the first protrusion portion 18b of an adjacent wiring pattern 18 is disposed between the second protrusion portions 18c of each wiring pattern 18. Additionally, the pattern for power 16 has a stripe-shaped portion 16a extending in the shape of a straight line in the X-axis direction, and a protrusion portion 16b protruding in the shape of a trapezoid between the second protrusion portions 18c of an adjacent wiring pattern 18 in the Y-axis direction from the stripe-shaped portion 16a. Additionally, the pattern for ground 17 has a stripe-shaped portion 17a extending in the shape of a straight line in the X-axis direction, and a protrusion portion 17c protruding in the shape of a trapezoid between the first protrusion portions 18b of an adjacent wiring pattern 18 in a direction opposite to the Y-axis direction from the stripe-shaped portion 17a. Additionally, although this embodiment shows that the shape of the pattern for power 16 and the pattern for ground 17 is different from the shape of the wiring pattern 18, the shape of the pattern for power 16 and the pattern for ground 17 may be the same as the shape of the wiring pattern 18.

As shown in FIG. 1(A), in each wiring pattern 18 of this embodiment, five LED devices 13 are disposed corresponding to five first protrusion portions 18b, and five LED devices 13 are disposed in the stripe-shaped portion 18a at locations corresponding to five second protrusion portions 18c. Additionally, in the pattern for power 16, five LED devices 13 are disposed corresponding to five protrusion portions 16b, and five LED devices 13 are disposed at locations corresponding to the second protrusion portion 18c of an adjacent wiring pattern 18 in the Y-axis direction. As described above, in each wiring pattern 18 and the pattern for power 16, tens LED devices 13 are arranged in two rows in the Y-axis direction, and the forty LED devices 13 on the substrate 11 are disposed in a staggered arrangement on the whole.

Each LED device 13 has, for example, a rectangular shape in the plane of 2.0 mm (X-axis direction length)×2.0 mm (Y-axis direction length) (FIG. 1(A)), and has a cathode terminal 14 on the upper surface and an anode terminal (not shown) on the lower surface. Additionally, the anode terminal (first electrode) is bonded to an immediately underlying wiring pattern 18 (to be specific, the first protrusion portion 18b or the stripe-shaped portion 18a) or the pattern for power 16 (to be specific, the protrusion portion 16b or the stripe-shaped portion 16a) with a die bonding agent (not shown). The die bonding agent is an element for mechanically and electrically bonding the LED device 13 to the wiring pattern 18 or the pattern for power 16, and for example, a conductive silver (Ag) paste is used. Additionally, the cathode terminals 14 of each LED device 13 are electrically connected to the stripe-shaped portion 18a and the second protrusion portion 18c of an adjacent wiring pattern 18 or the stripe-shaped portion 17a and the protrusion portion 17c of the pattern for ground 17 with a wire 15.

Figure 11A:
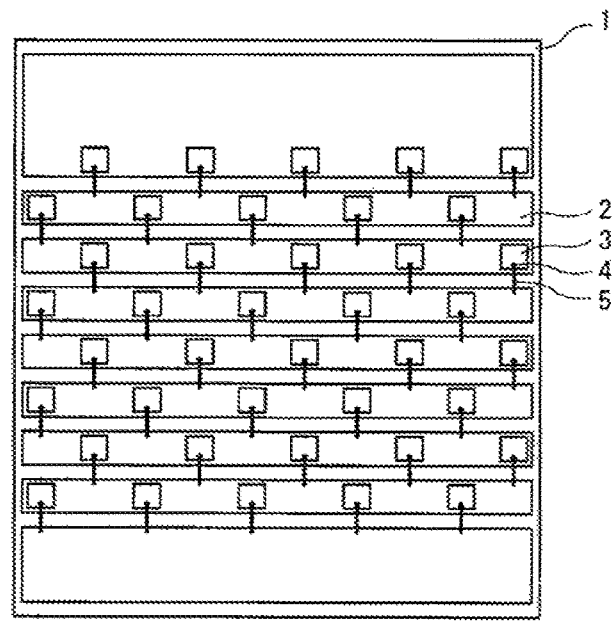
FIGS. 11A and 11B are diagrams illustrating the configuration of a light illumination module according to the related art.
Figure 11B:
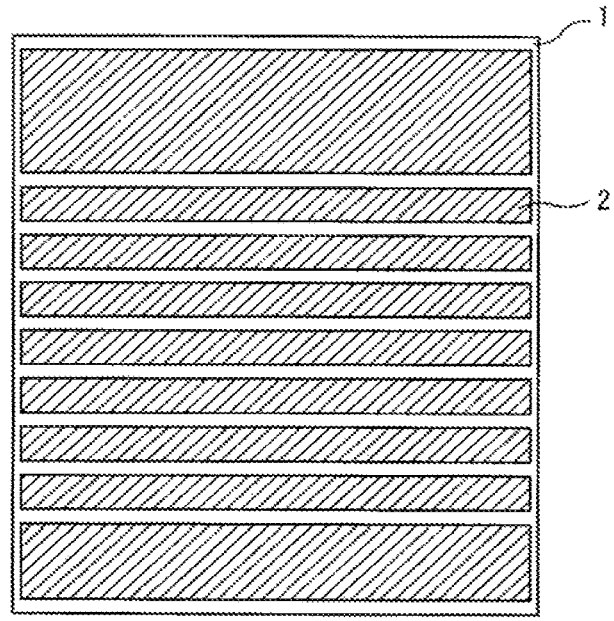

As described above, in this embodiment, on each wiring pattern 18 and the pattern for power 16, ten LED devices 13 arranged in two rows in the Y-axis direction are connected in parallel. Additionally, ten LED devices 13 on an adjacent wiring pattern 18 in the Y-axis direction are connected in series to each other. Accordingly, when the power terminal (not shown) of the external power source device (not shown) is connected to the pattern for power 16 and the ground terminal (not shown) of the external power source device is connected to the pattern for ground 17, upon application of a predetermined operating voltage Vp, forty LED devices 13 may operate at the same time. Additionally, when the operating voltage Vf of each LED device 13 is 5 (v), Vp=5 (v)×4 rows=20 (v) is applied as the operating voltage Vp of the entire light illumination module 10, and compared with the conventional configuration (FIG. 11), it is possible to operate the light illumination module 10 at significantly low voltage (i.e., 50% operating voltage).

While the embodiment of the present disclosure has been hereinabove described, the present disclosure is not limited to the configuration of the embodiment described above, and various modifications may be made thereto within the scope of technical spirit.

For example, although it is described that in the light illumination module 10 of this embodiment, forty LED devices 13 are disposed in a staggered arrangement in an array of 5 (X-axis direction)×8 (Y-axis direction), the number of LED devices 13 or the number of rows is not limited and may be properly selected according to the specification.

Although it is described that the LED device 13 of this embodiment emits UV light, the present disclosure is not limited to this configuration, and for example, the LED device 13 may emit visible or infrared light.

Second Embodiment

Figure 2A:
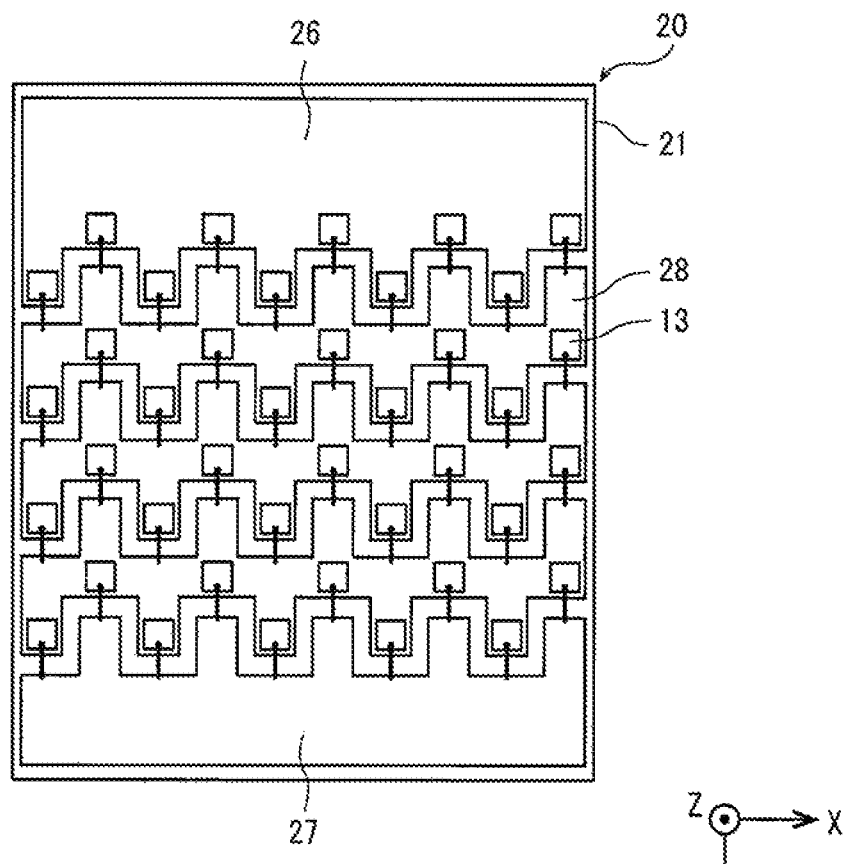
FIGS. 2A and 2B are diagrams illustrating the configuration of a light illumination module according to a second embodiment of the present disclosure.
Figure 2B:
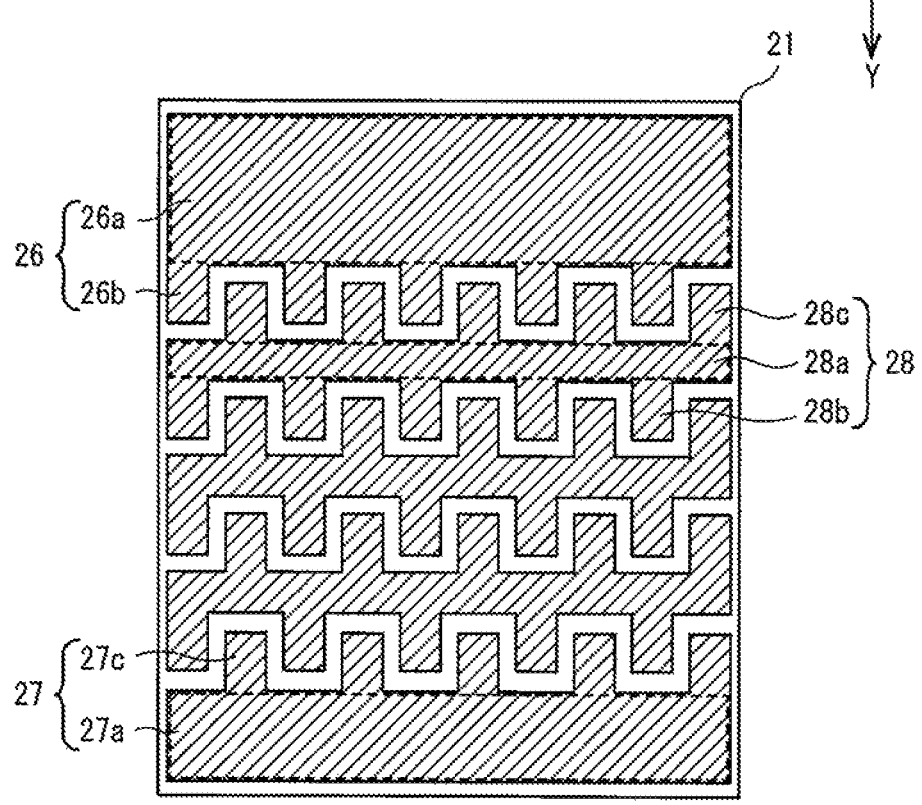

FIG. 2 is a diagram illustrating a schematic configuration of a light illumination module 20 according to a second embodiment of the present disclosure. FIG. 2(A) is a plane view of the light illumination module 20, and FIG. 2(B) is a wiring pattern diagram of the light illumination module 20. The light illumination module 20 of this embodiment is different from the light illumination module 10 of the first embodiment in that a first protrusion portion 28b and a second protrusion portion 28c of each wiring pattern 28 protrude in the shape of a rectangle with approximately the same width as the LED device 13 from a stripe-shaped portion 28a, a protrusion portion 26b of a pattern for power 26 protrudes in the shape of a rectangle with approximately the same width as the LED device 13 from a stripe-shaped portion 26a, and a protrusion portion 27c of a pattern for ground 27 protrudes in the shape of a rectangle with approximately the same width as the LED device 13 from a stripe-shaped portion 27a.

In this embodiment, similar to the first embodiment, on each wiring pattern 28 and the pattern for power 26, ten LED devices 13 arranged in two rows in the Y-axis direction are connected in parallel. Additionally, ten LED devices 13 on an adjacent wiring pattern 28 in the Y-axis direction are connected in series to each other. Accordingly, compared with the conventional configuration (FIG. 11), it is possible to operate the light illumination module 20 at significantly low voltage (i.e., 50% operating voltage).

Third Embodiment

Figure 3A:
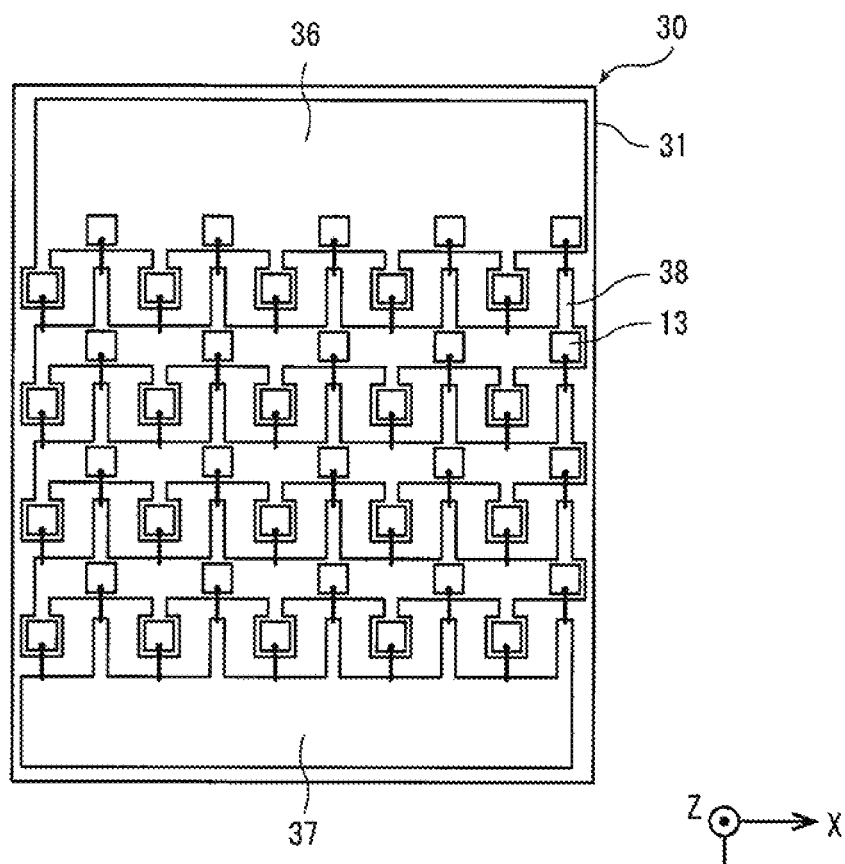
FIGS. 3A and 3B are diagrams illustrating the configuration of a light illumination module according to a third embodiment of the present disclosure.
Figure 3B:
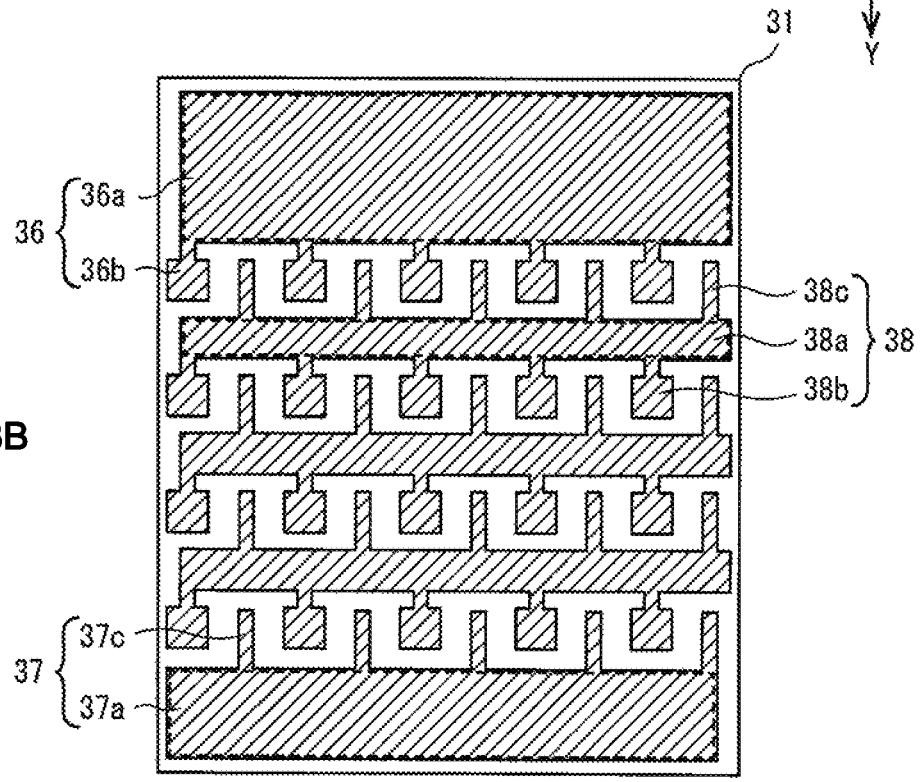

FIG. 3 is a diagram illustrating a schematic configuration of a light illumination module 30 according to a third embodiment of the present disclosure. FIG. 3(A) is a plane view of the light illumination module 30, and FIG. 3(B) is a wiring pattern diagram of the light illumination module 30. The light illumination module 30 of this embodiment is different from the light illumination module 20 of the second embodiment in that a pad of approximately the same rectangular shape as the size of the LED device 13 is formed at the front part of a first protrusion portion 38b of each wiring pattern 38 and the front part of a protrusion portion 36b of a pattern for power 36, part other than the front part is thinner than the width of the LED device 13, and a second protrusion portion 38c of each wiring pattern 38 and a protrusion portion 37c of a pattern for ground 37 are thin.

In this embodiment, similar to the second embodiment, on each wiring pattern 38 and the pattern for power 36, ten LED devices 13 arranged in two rows in the Y-axis direction are connected in parallel. Additionally, ten LED devices 13 on an adjacent wiring pattern 38 in the Y-axis direction are connected in series to each other. Accordingly, compared with the conventional configuration (FIG. 11), it is possible to operate the light illumination module 30 at significantly low voltage (i.e., 50% operating voltage). Additionally, in this embodiment, because the rectangular pad portion is formed at the front part of the first protrusion portion 38b and the front part of the protrusion portion 36b, and part other than the front part is thin, when the LED device 13 is mounted at the front part of the first protrusion portion 38b and the front part of the protrusion portion 36b, the die bonding agent stays in the pad portion, thereby preventing the LED device 13 from being incorrectly positioned.

Fourth Embodiment

Figure 4A:
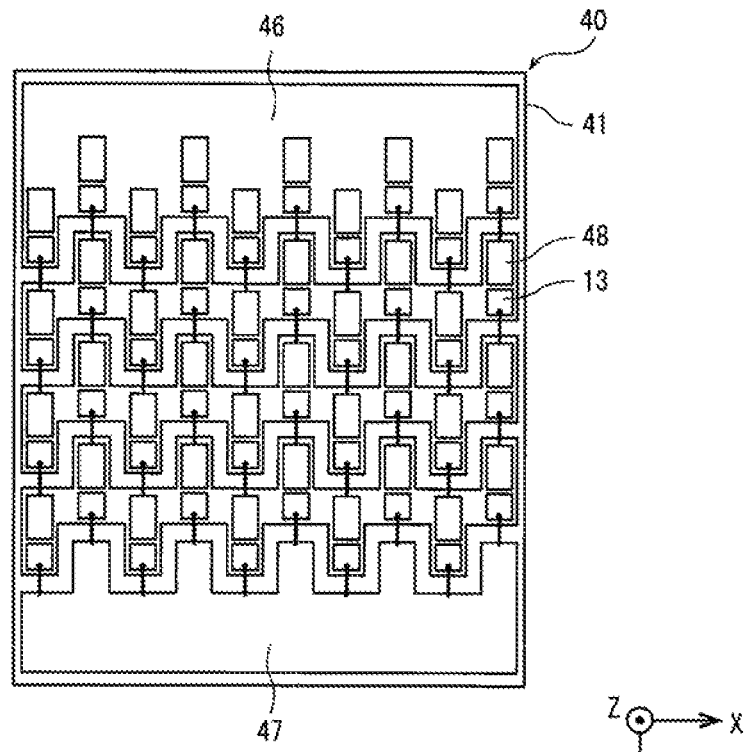
FIGS. 4A and 4B are diagrams illustrating the configuration of a light illumination module according to a fourth embodiment of the present disclosure.
Figure 4B:
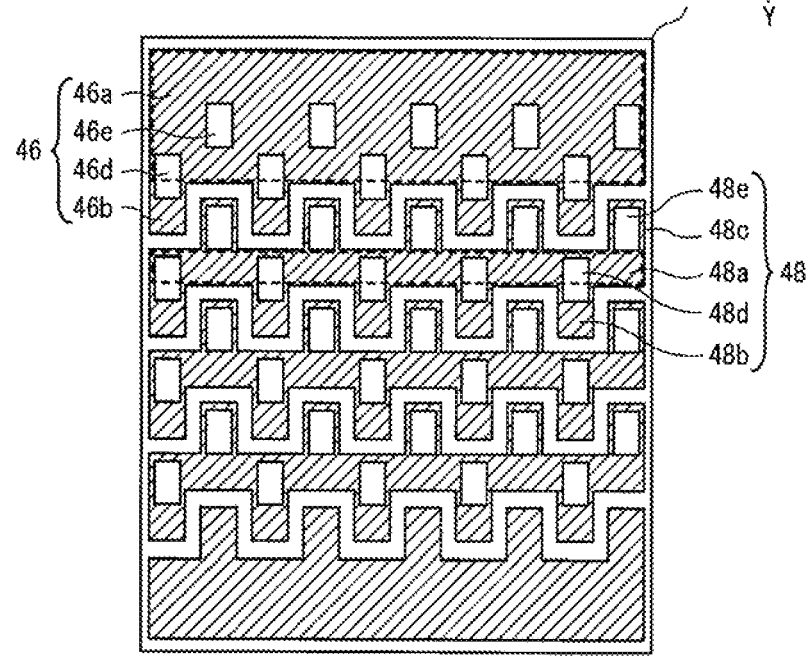

FIG. 4 is a diagram illustrating a schematic configuration of a light illumination module 40 according to a fourth embodiment of the present disclosure. FIG. 4(A) is a plane view of the light illumination module 40, and FIG. 4(B) is a wiring pattern diagram of the light illumination module 40. The light illumination module 40 of this embodiment is different from the light illumination module 20 of the second embodiment in that a rectangular blank pattern 48d (a non-patterned area) is formed near an area in which the LED device 13 of a first protrusion portion 48b on each wiring pattern 48 is disposed, a rectangular blank pattern 48e (a non-patterned area) is formed at approximately the center of a second protrusion portion 48c on each wiring pattern 48, a rectangular blank pattern 46d (a non-patterned area) is formed near an area in which the LED device 13 of a protrusion portion 46b on a pattern for power 46 is disposed, and a rectangular blank pattern 46e (a non-patterned area) is formed near an area in which the LED device 13 of a stripe-shaped portion 46a on the pattern for power 46 is disposed.

In this embodiment, similar to the second embodiment, on each wiring pattern 48 and the pattern for power 46, ten LED devices 13 arranged in two rows in the Y-axis direction are connected in parallel. Additionally, ten LED devices 13 on an adjacent wiring pattern 48 in the Y-axis direction are connected in series to each other. Accordingly, compared with the conventional configuration (FIG. 11), it is possible to operate the light illumination module 40 at significantly low voltage (i.e., 50% operating voltage). Additionally, in this embodiment, because the rectangular blank pattern 48d, 48e, 46d, 46e is formed near the LED device 13, when the LED device 13 is mounted on the wiring pattern 48 and the pattern for power 46, the die bonding agent stays in a predetermined location, thereby preventing the LED device 13 from being incorrectly positioned.

Fifth Embodiment

Figure 5A:
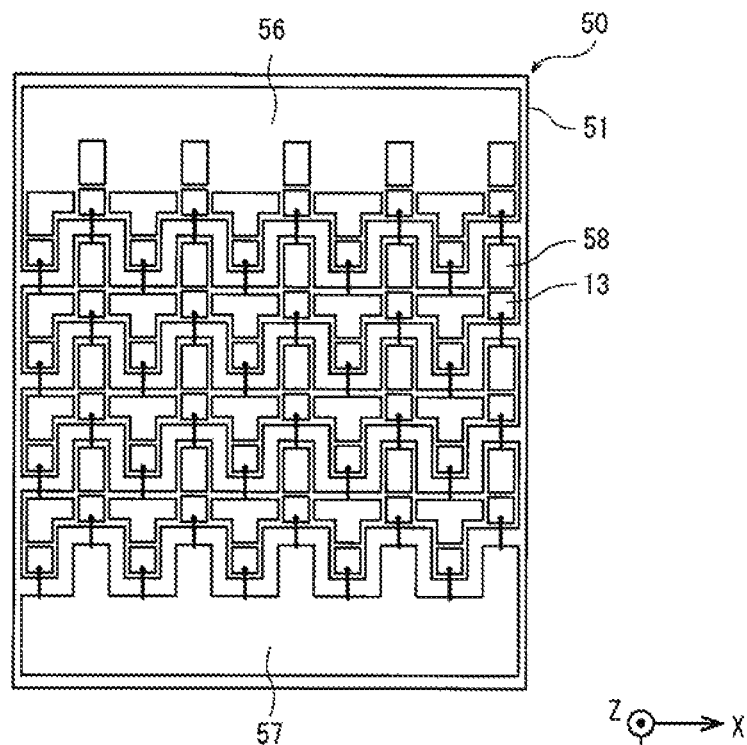
FIGS. 5A and 5B are diagrams illustrating the configuration of a light illumination module according to a fifth embodiment of the present disclosure.
Figure 5B:
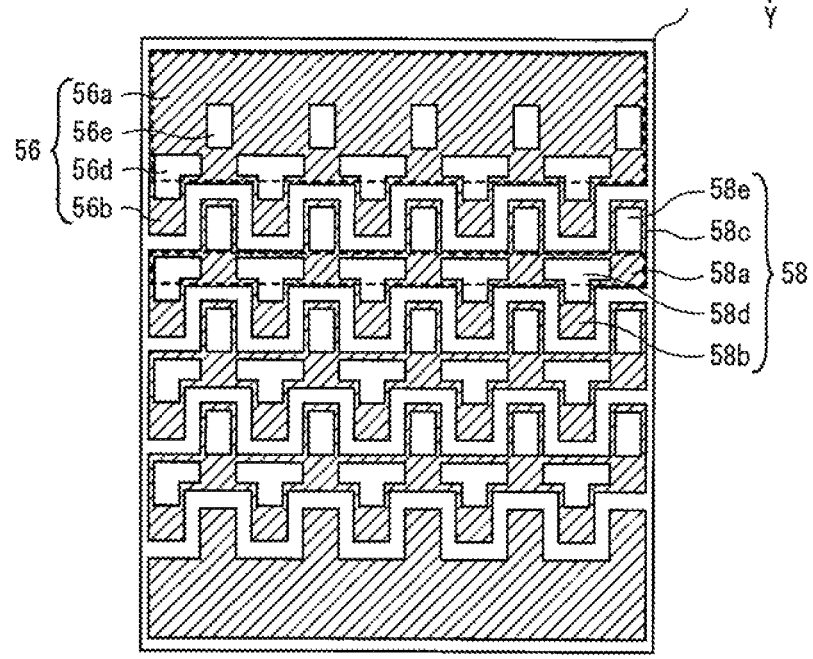

FIG. 5 is a diagram illustrating a schematic configuration of a light illumination module 50 according to a fifth embodiment of the present disclosure. FIG. 5(A) is a plane view of the light illumination module 50, and FIG. 5(B) is a wiring pattern diagram of the light illumination module 50. The light illumination module 50 of this embodiment is different from the light illumination module 40 of the fourth embodiment in that a blank pattern 58d (a non-patterned area) on each wiring pattern 58 is so wide in the X-axis direction and a direction opposite to the X-axis direction in a stripe-shaped portion 58a that it is formed near the LED device 13 disposed in the stripe-shaped portion 58a, and a blank pattern 56d (a non-patterned area) on a pattern for power 56 is so wide in the X-axis direction and a direction opposite to the X-axis direction in a stripe-shaped portion 56a that it is formed near the LED device 13 disposed in the stripe-shaped portion 56a.

In this embodiment, similar to the fourth embodiment, on each wiring pattern 58 and the pattern for power 56, ten LED devices 13 arranged in two rows in the Y-axis direction are connected in parallel. Additionally, ten LED devices 13 on an adjacent wiring pattern 58 in the Y-axis direction are connected in series to each other. Accordingly, compared with the conventional configuration (FIG. 11), it is possible to operate the light illumination module 50 at significantly low voltage (i.e., 50% operating voltage). Additionally, in this embodiment, because the blank pattern 58d, 58e, 56d, 56e is formed near the LED device 13, when the LED device 13 is mounted on the wiring pattern 58 and the pattern for power 56, the die bonding agent stays in a predetermined location, thereby preventing the LED device 13 from being incorrectly positioned.

Sixth Embodiment

Figure 6A:
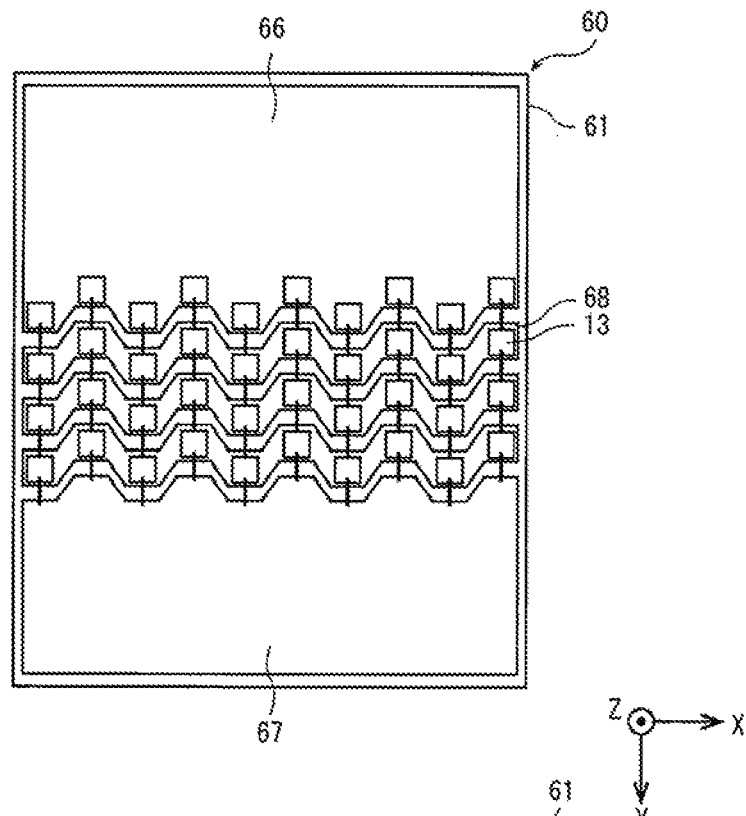
FIGS. 6A and 6B are diagrams illustrating the configuration of a light illumination module according to a sixth embodiment of the present disclosure.
Figure 6B:
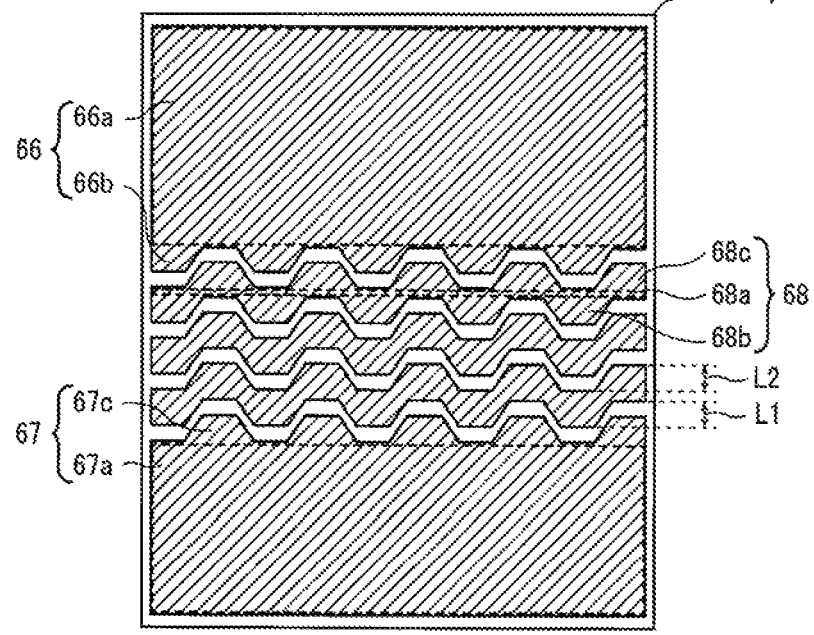

FIG. 6 is a diagram illustrating a schematic configuration of a light illumination module 60 according to a sixth embodiment of the present disclosure. FIG. 6(A) is a plane view of the light illumination module 60, and FIG. 6(B) is a wiring pattern diagram of the light illumination module 60. The light illumination module 60 of this embodiment is different from the light illumination module 10 of the first embodiment in that the Y-direction width of a stripe-shaped portion 68a of each wiring pattern 28 is narrower than the width of the LED device 13, an amount of protrusion (length L1 in FIG. 6(B)) of a first protrusion portion 68b and an amount of protrusion (length L2 in FIG. 6(B)) of a second protrusion portion 68c are smaller than the light illumination module 10 according to the first embodiment, an amount of protrusion of a protrusion portion 66b of a pattern for power 66 is smaller than the light illumination module 10 according to the first embodiment, and an amount of protrusion of a protrusion portion 67c of a pattern for ground 67 is smaller than the light illumination module 10 according to the first embodiment.

As shown in FIG. 6, when the Y-axis direction width of the stripe-shaped portion 68a of each wiring pattern 28 is narrower than the width of the LED device 13, the LED device 13 disposed on the stripe-shaped portion 68a at a location corresponding to the second protrusion portion 68c is disposed over the stripe-shaped portion 68a and the second protrusion portion 68c. In this instance, as shown in FIG. 6, the LED device 13 disposed on the first protrusion portion 68b may be disposed over the stripe-shaped portion 68a and the first protrusion portion 68b. Additionally, the amount of protrusion (i.e., length L1) of the first protrusion portion 68b and the amount of protrusion (i.e., length L2) of the second protrusion portion 68c may be equal or different.

In this embodiment, similar to the first embodiment, on each wiring pattern 68 and the pattern for power 66, ten LED devices 13 arranged in two rows in the Y-axis direction are connected in parallel. Additionally, ten LED devices 13 on an adjacent wiring pattern 68 in the Y-axis direction are connected in series to each other. Accordingly, compared with the conventional configuration (FIG. 11), it is possible to operate the light illumination module 60 at significantly low voltage (i.e., 50% operating voltage). Additionally, in this embodiment, because the amount of protrusion of the first protrusion portion 68b, the second protrusion portion 68c, the protrusion portion 66b and the protrusion portion 67c is small and the width of the stripe-shaped portion 68a is narrow, the LED devices 13 are densely arranged at the Y-axis direction central part of a substrate 61.

Seventh Embodiment

Figure 7A:
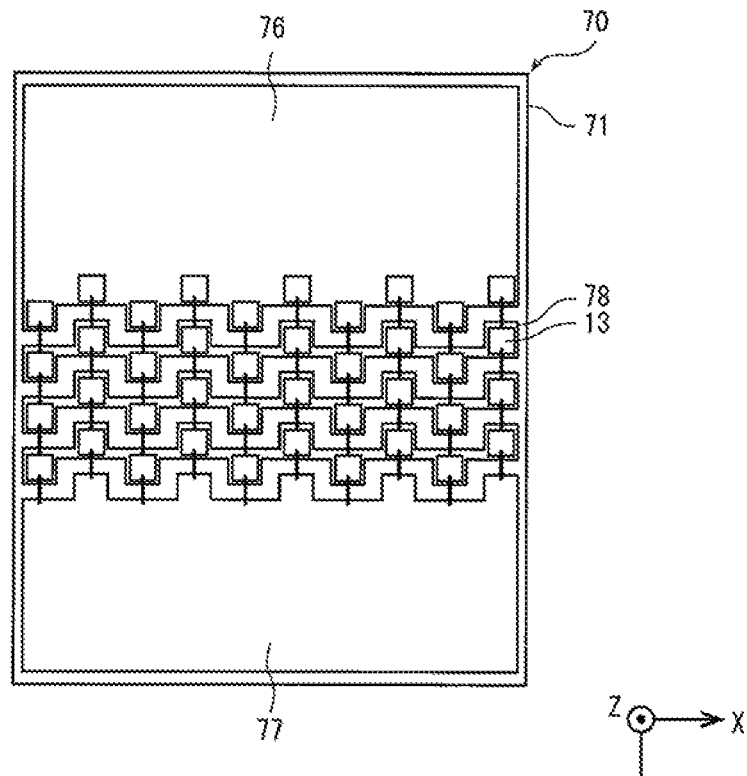
FIGS. 7A and 7B are diagrams illustrating the configuration of a light illumination module according to a seventh embodiment of the present disclosure.
Figure 7B:
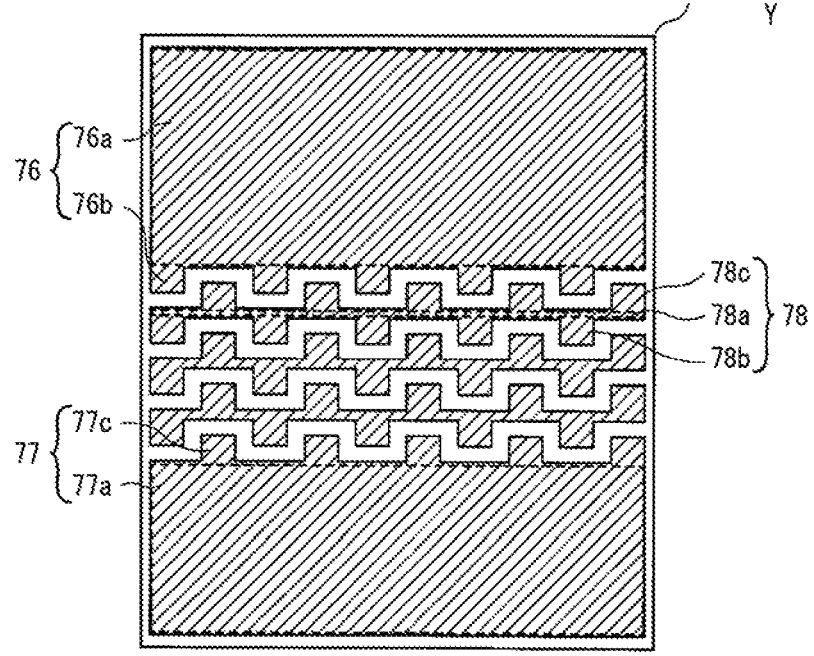

FIG. 7 is a diagram illustrating a schematic configuration of a light illumination module 70 according to a seventh embodiment of the present disclosure. FIG. 7(A) is a plane view of the light illumination module 70, and FIG. 7(B) is a wiring pattern diagram of the light illumination module 70. The light illumination module 70 of this embodiment is different from the light illumination module 20 of the second embodiment in that the Y-axis direction width of a stripe-shaped portion 78a of each wiring pattern 78 is narrower than the width of the LED device 13, an amount of protrusion of a first protrusion portion 78b and a second protrusion portion 78c is smaller than the light illumination module 20 according to the second embodiment, an amount of protrusion of a protrusion portion 76b of a pattern for power 76 is smaller than the light illumination module 20 according to the second embodiment, and an amount of protrusion of a protrusion portion 77c of a pattern for ground 77 is smaller than the light illumination module 20 according to the second embodiment.

In this embodiment, similar to the second embodiment, on each wiring pattern 78 and the pattern for power 76, ten LED devices 13 arranged in two rows in the Y-axis direction are connected in parallel. Additionally, ten LED devices 13 on an adjacent wiring pattern 78 in the Y-axis direction are connected in series to each other. Accordingly, compared with the conventional configuration (FIG. 11), it is possible to operate the light illumination module 70 at significantly low voltage (i.e., 50% operating voltage). Additionally, in this embodiment, because the amount of protrusion of the first protrusion portion 78b, the second protrusion portion 78c, the protrusion portion 76b and the protrusion portion 77c is small and the width of the stripe-shaped portion 78a is narrow, the LED devices 13 are densely arranged at the Y-axis direction central part of a substrate 71.

While the light illumination modules according to the first to seventh embodiments of the present disclosure have been hereinabove described, the present disclosure is not limited to the configurations of the embodiments described above, and a variety of modifications may be made thereto. For example, in the first to seventh embodiments, the amount of protrusion (Y-axis direction length) of the first protrusion portion 18b of each wiring pattern 18, the amount of protrusion (Y-axis direction length) of the second protrusion portion 18c, the amount of protrusion (Y-axis direction length) of the protrusion portion 16b of the pattern for power 16, and the amount of protrusion (Y-axis direction length) of the protrusion portion 17c of the pattern for ground 17 may be equal or different.

Although in the light illumination modules according to the first to seventh embodiments of the present disclosure, it is described that forty LED devices 13 are disposed in a staggered arrangement in an array of 5 (X-axis direction)×8 (Y-axis direction), the present disclosure is not necessarily limited to this configuration.

Eighth Embodiment

Figure 8:
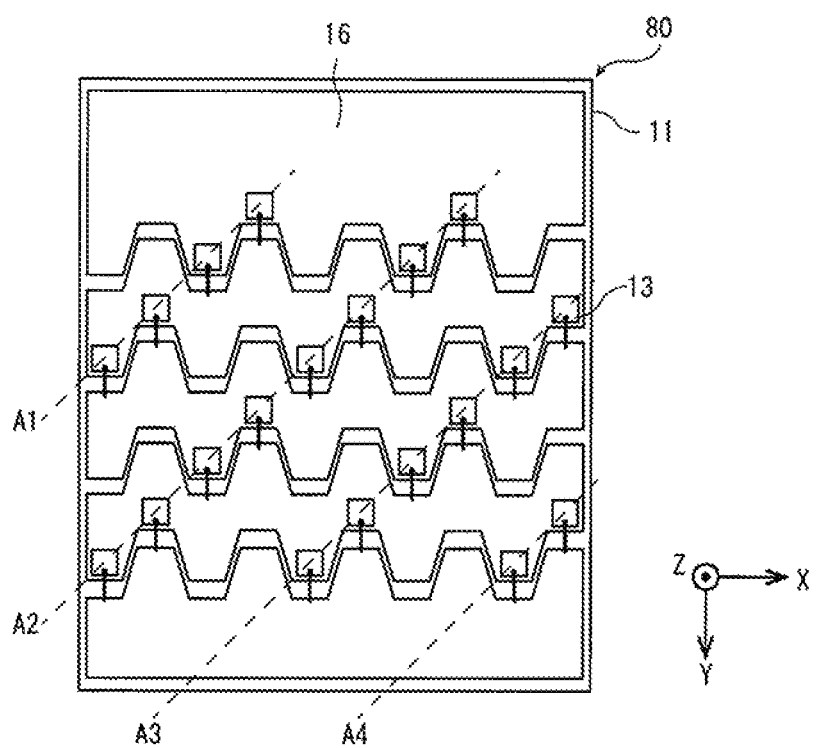
FIG. 8 is a diagram illustrating the configuration of a light illumination module according to an eighth embodiment of the present disclosure.

FIG. 8 is a plane view illustrating a schematic configuration of a light illumination module 80 according to an eighth embodiment of the present disclosure. The light illumination module 80 of this embodiment includes a common substrate 11 with the light illumination module 10 according to the first embodiment, and it is different from the light illumination module 10 according to the first embodiment in that the LED devices 13 are disposed in an alternate arrangement.

That is, the light illumination module 80 of this embodiment is different from the light illumination module 10 according to the first embodiment in that twenty LED devices 13 are arranged by alternating, in the X-axis direction, the LED devices (see FIG. 1) of the light illumination module 10 according to the first embodiment arranged in an array of 5 (X-axis direction)×8 (Y-axis direction). Additionally, as shown in FIG. 8, the LED devices 13 of this embodiment are arranged along virtual straight lines A1, A2, A3, A4 extending in parallel in an oblique direction to irradiate UV light thoroughly onto the target (print media) that relatively moves, for example, in the X- or Y-axis direction.

In the same way as the light illumination module 80 of this embodiment, it is possible to freely set the irradiation strength of light necessary for the target by properly alternating the LED devices 13. In other words, if the LED devices 13 are disposed in a proper alternate arrangement according to the required irradiation intensity of light, the LED devices 13 do not necessarily need to be arranged along the virtual straight lines A1, A2, A3, A4.

Ninth Embodiment

Figure 9:
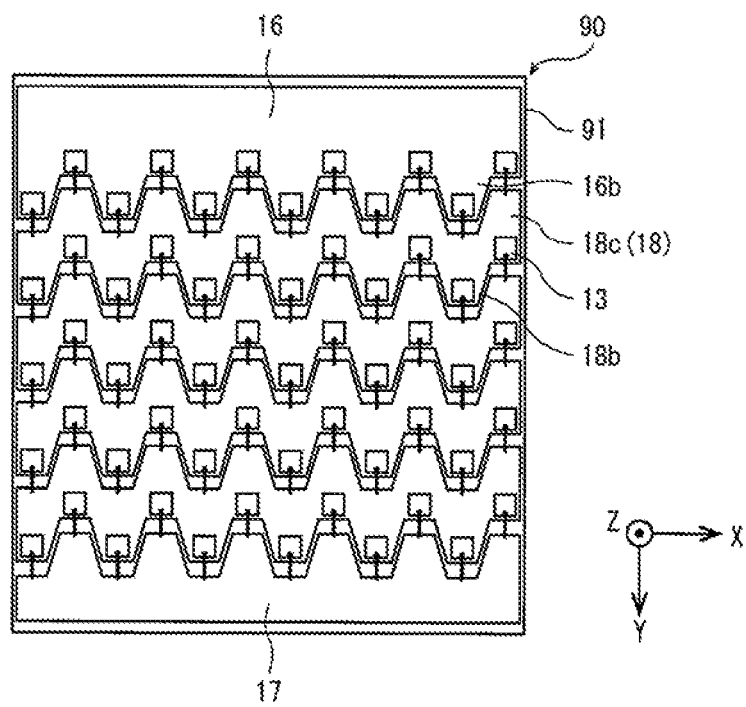
FIG. 9 is a diagram illustrating the configuration of a light illumination module according to a ninth embodiment of the present disclosure.

FIG. 9 is a plane view illustrating a schematic configuration of a light illumination module 90 according to a ninth embodiment of the present disclosure. The light illumination module 90 of this embodiment is different from the light illumination module 10 according to the first embodiment in that four wiring patterns 18 are formed, six first protrusion portions 18b and six second protrusion portions 18c are formed, six protrusion portions 16b are formed on the pattern for power 16, and sixty LED devices 13 are disposed in a staggered arrangement in an array of 6 (X-axis direction)×10 (Y-axis direction).

As described above, in this embodiment, on each wiring pattern 18 and the pattern for power 16, twelve LED devices 13 arranged in two rows in the Y-axis direction are connected in parallel. Additionally, twelve LED devices 13 on an adjacent wiring pattern 18 in the Y-axis direction are connected in series to each other. Accordingly, when the power terminal (not shown) of the external power source device (not shown) is connected to the pattern for power 16, the ground terminal (not shown) of the external power source device is connected to the pattern for ground 17, upon application of a predetermined operating voltage Vp, sixty LED devices 13 may operate at the same time. Additionally, when the operating voltage Vf of each LED device 13 is 5 (v), Vp=5 (v)×5 rows=25 (v) is applied as the operating voltage Vp of the entire light illumination module 90, and compared with the conventional configuration (FIG. 11), it is possible to operate the light illumination module 90 at significantly low voltage (i.e., 62.5% operating voltage).

Tenth Embodiment

Figure 10A:
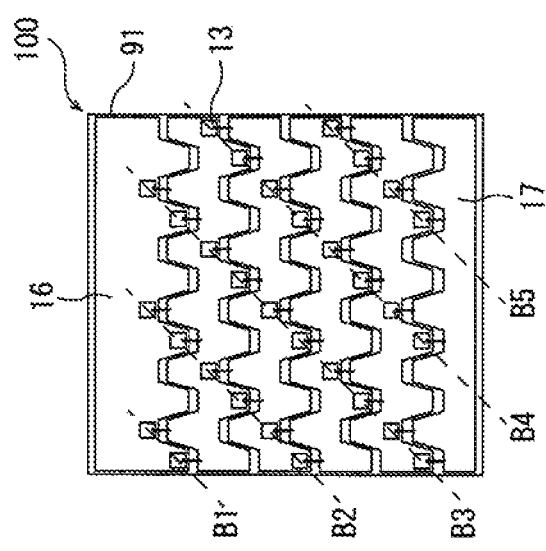
FIGS. 10A and 10B are diagrams illustrating the configuration of a light illumination module according to a tenth embodiment of the present disclosure.
Figure 10B:
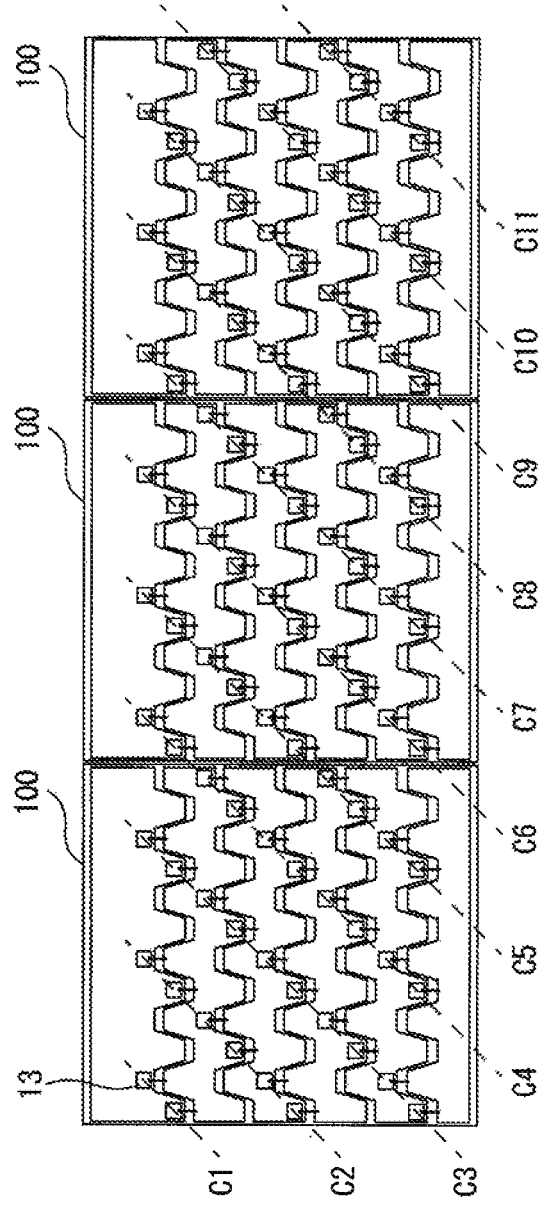

FIG. 10 is a diagram illustrating a schematic configuration of a light illumination module 100 according to a tenth embodiment of the present disclosure; FIG. 10(A) is a plane view, and FIG. 10(B) is a plane view showing three light illumination modules 100 connected in the X-axis direction. The light illumination module 100 of this embodiment includes a common substrate 91 with the light illumination module 90 according to the ninth embodiment, and it is different from the light illumination module 90 according to the ninth embodiment in that the LED devices 13 are disposed in an alternate arrangement.

That is, the light illumination module 90 of this embodiment is different from the light illumination module 90 according to the ninth embodiment in that thirty LED devices 13 are arranged by alternating, in the X-axis direction, the LED devices 13 (see FIG. 9) of the light illumination module 90 according to the ninth embodiment arranged in an array of 6 (X-axis direction)×10 (Y-axis direction). Additionally, as shown in FIG. 8, the LED devices 13 of this embodiment are arranged along virtual straight lines B1, B2, B3, B4 extending in parallel in an oblique direction, for example, to irradiate UV light thoroughly onto the target (print media) that relatively moves in the X- or Y-axis direction.

Additionally, as shown in FIG. 10(B), the light illumination module 90 of this embodiment is configured to allow connection in the X-axis direction, and when the light illumination modules 90 are connected in the X-axis direction, the LED devices 13 are arranged along virtual straight lines C1~C11 extending in parallel in an oblique direction, so that regularity in arrangement of the LED devices 13 in the X-axis direction and Y-axis direction is maintained. According to the configuration of this embodiment, by connecting the plurality of light illumination modules 90, it is possible to freely set the irradiation width in the X-axis direction, and for example, to irradiate UV light thoroughly onto the target (print media) that relatively moves in the X- or Y-axis direction.

In the same way as the light illumination module 90 of this embodiment, it is possible to freely set the irradiation strength of light necessary for the target by properly alternating the LED devices 13. In other words, if the LED devices 13 are disposed in a proper alternate arrangement according to the required irradiation intensity of light, the LED devices 13 do not necessarily need to be arranged along the virtual straight lines C1~C11.

It should be further understood that the disclosed experiments are illustrative in all aspects and are not limitative. The scope of the present disclosure is defined by the appended claims rather than the foregoing description, and encompasses all changes within the scope of the appended claims and the equivalent meaning and scope.

DETAILED DESCRIPTION OF MAIN ELEMENTS 1, 11, 21, 31, 41, 51, 61, 71, 91 . . . Substrate
2 . . . Stripe-shaped wiring
3, 13 . . . LED device
4 . . . Top electrode
5, 15 . . . Wire
10, 20, 30, 40, 50, 60, 70, 80, 90, 100 . . . Light illumination module
14 . . . Cathode terminal
16, 26, 36, 46, 56, 66, 76 . . . Pattern for power
16a, 26a, 36a, 46a, 56a, 66a, 76a . . . Stripe-shaped portion
16b, 26b, 36b, 46b, 56b, 66b, 76b . . . Protrusion portion
17, 27, 37, 47, 57, 67, 77 . . . Pattern for ground
17a, 27a, 37a, 47a, 57a, 67a, 77a . . . Stripe-shaped portion
17c, 27c, 37c, 47c, 57c, 67c, 77c . . . Protrusion portion
18, 28, 38, 48, 58, 68, 78 . . . Wiring pattern
18a, 28a, 38a, 48a, 58a, 68a, 78a . . . Stripe-shaped portion
18b, 28b, 38b, 48b, 58b, 68b, 78b . . . First protrusion portion
18c, 28c, 38c, 48c, 58c, 68c, 78c . . . Second protrusion portion
46d, 46e, 48d, 48e, 56d, 56e, 58d, 58e . . . Blank pattern

The invention claimed is:

1. A light illumination module, comprising:
a substrate, a plurality of wiring patterns formed in parallel on the substrate, and a plurality of light emitting diode (LED) devices disposed on the wiring patterns to emit light in a direction perpendicular to a surface of the substrate,
wherein each wiring pattern has:
a stripe-shaped portion extending in a shape of a straight line in a first direction on the surface of the substrate,
a first protrusion portion protruding in a second direction perpendicular to the first direction from the stripe-shaped portion, and
a second protrusion portion protruding in a direction opposite to the second direction from the stripe-shaped portion,
the first protrusion portion and the second protrusion portion are formed in an alternating manner along the first direction,
the plurality of LED devices is disposed on the first protrusion portion and the stripe-shaped portion at a location corresponding to the second protrusion portion, and
a first electrode of each LED device is electrically connected to the first protrusion portion or the stripe-shaped portion immediately below, and a second electrode of each LED device is electrically connected to the stripe-shaped portion or the second protrusion portion of an adjacent wiring pattern with a wire.

2. The light illumination module according to claim 1, wherein the first protrusion portion and the second protrusion portion show a trapezoidal shape.

3. The light illumination module according to claim 1, wherein the first protrusion portion and the second protrusion portion show a rectangular shape.

4. The light illumination module according to claim 3, wherein a non-patterned area is installed at a location near each LED device of the stripe-shaped portion, the first protrusion portion and the second protrusion portion.

5. The light illumination module according to claim 1, wherein a front part of the first protrusion portion is approximately the same as a size of the LED device, and part other than the front part is thinner than a width of the LED device.

6. The light illumination module according to claim 1, wherein a width of the second direction of the stripe-shaped portion is wider than the width of the LED device.

7. The light illumination module according to claim 1, wherein a width of the second direction of the stripe-shaped portion is narrower than the width of the LED device.

8. The light illumination module according to claim 1, wherein the plurality of LED devices is disposed in a staggered arrangement over the substrate.

9. A wiring substrate for a light emitting diode (LED) device, comprising:
a substrate, and a plurality of wiring patterns formed in parallel on the substrate to supply power to a plurality of LED devices disposed on the substrate, wherein each wiring pattern has:
a stripe-shaped portion extending in a shape of a straight line in a first direction on a surface of the substrate,
a first protrusion portion protruding in a second direction perpendicular to the first direction from the stripe-shaped portion, and
a second protrusion portion protruding in a direction opposite to the second direction from the stripe-shaped portion,
the first protrusion portion and the second protrusion portion are formed in an alternating manner along the first direction, and
a LED placement area for placing the LED device is formed on the first protrusion portion and the stripe-shaped portion at a location corresponding to the second protrusion portion.

10. The wiring substrate for a LED device according to claim 9, wherein the first protrusion portion and the second protrusion portion show a trapezoidal shape.

11. The wiring substrate for a LED device according to claim 9, wherein the first protrusion portion and the second protrusion portion show a rectangular shape.

12. The wiring substrate for a LED device according to claim 11, wherein a non-patterned area is installed at a location near the LED placement area of the stripe-shaped portion, the first protrusion portion and the second protrusion portion.

13. The wiring substrate for a LED device according to claim 9, wherein a front part of the first protrusion portion is approximately the same as a size of the LED device, and part other than the front part is thinner than a width of the LED device.

14. The wiring substrate for a LED device according to claim 9, wherein a width of the second direction of the stripe-shaped portion is wider than the width of the LED device.

15. The wiring substrate for a LED device according to claim 9, wherein a width of the second direction of the stripe-shaped portion is narrower than the width of the LED device.

* * * * *